US008305706B2

(12) United States Patent
Kerns et al.

(10) Patent No.: US 8,305,706 B2
(45) Date of Patent: Nov. 6, 2012

(54) DISK LIBRARY SYSTEM INCLUDING ARRAY OF REMOVABLE DISK CARTRIDGES AND MOVABLE CONNECTOR SYSTEM

(75) Inventors: Randy Kerns, Boulder, CO (US); Michael H. Ulrich, Boulder, CO (US)

(73) Assignee: Imation Corp., Oakdale, MN (US)

( * ) Notice: Subject to any disclaimer, the term of this patent is extended or adjusted under 35 U.S.C. 154(b) by 992 days.

(21) Appl. No.: 12/171,516

(22) Filed: Jul. 11, 2008

(65) Prior Publication Data

US 2010/0007981 A1     Jan. 14, 2010

(51) Int. Cl.
*G11B 15/68* (2006.01)
(52) U.S. Cl. ...................................... 360/92.1
(58) Field of Classification Search .............. 360/92.1
See application file for complete search history.

(56) References Cited

U.S. PATENT DOCUMENTS

| 4,984,108 | A | * | 1/1991 | Grant et al. .................. 360/92.1 |
| 6,230,445 | B1 | | 5/2001 | Arko et al. |
| 2005/0152061 | A1 | * | 7/2005 | Hoelsaeter ..................... 360/92 |
| 2005/0231846 | A1 | | 10/2005 | Winarski et al. |
| 2006/0010285 | A1 | | 1/2006 | Georgis |
| 2006/0250766 | A1 | | 11/2006 | Blaalid et al. |
| 2007/0219948 | A1 | | 9/2007 | Bugovics |
| 2007/0236826 | A1 | | 10/2007 | Starr |
| 2008/0010324 | A1 | | 1/2008 | Stebner et al. |
| 2009/0019245 | A1 | | 1/2009 | Bondurant et al. |
| 2011/0107039 | A1 | | 5/2011 | Bondurant et al. |

OTHER PUBLICATIONS

PCT International Search Report and Written Opinion mailed Aug. 19, 2009; International Application No. PCT/US09/42904, 12 pages.

* cited by examiner

*Primary Examiner* — Allen Heinz
(74) *Attorney, Agent, or Firm* — Kenneth E. Levitt; Dorsey & Whitney LLP

(57) ABSTRACT

Embodiments presented herein provide a removable disk library system. The removable disk library system, in embodiments, comprises an array of removable disk drive bays and a movable connector system. Each removable disk drive bay can hold a removable disk drive cartridge. The movable connector system can be positioned behind the array of removable disk drive bays where the movable connector system can access the connector of the removable disk drive cartridges. In embodiments, the movable connector system includes a movable connector assembly that can automatically connect to the connector at the rear of the removable disk drive.

8 Claims, 14 Drawing Sheets

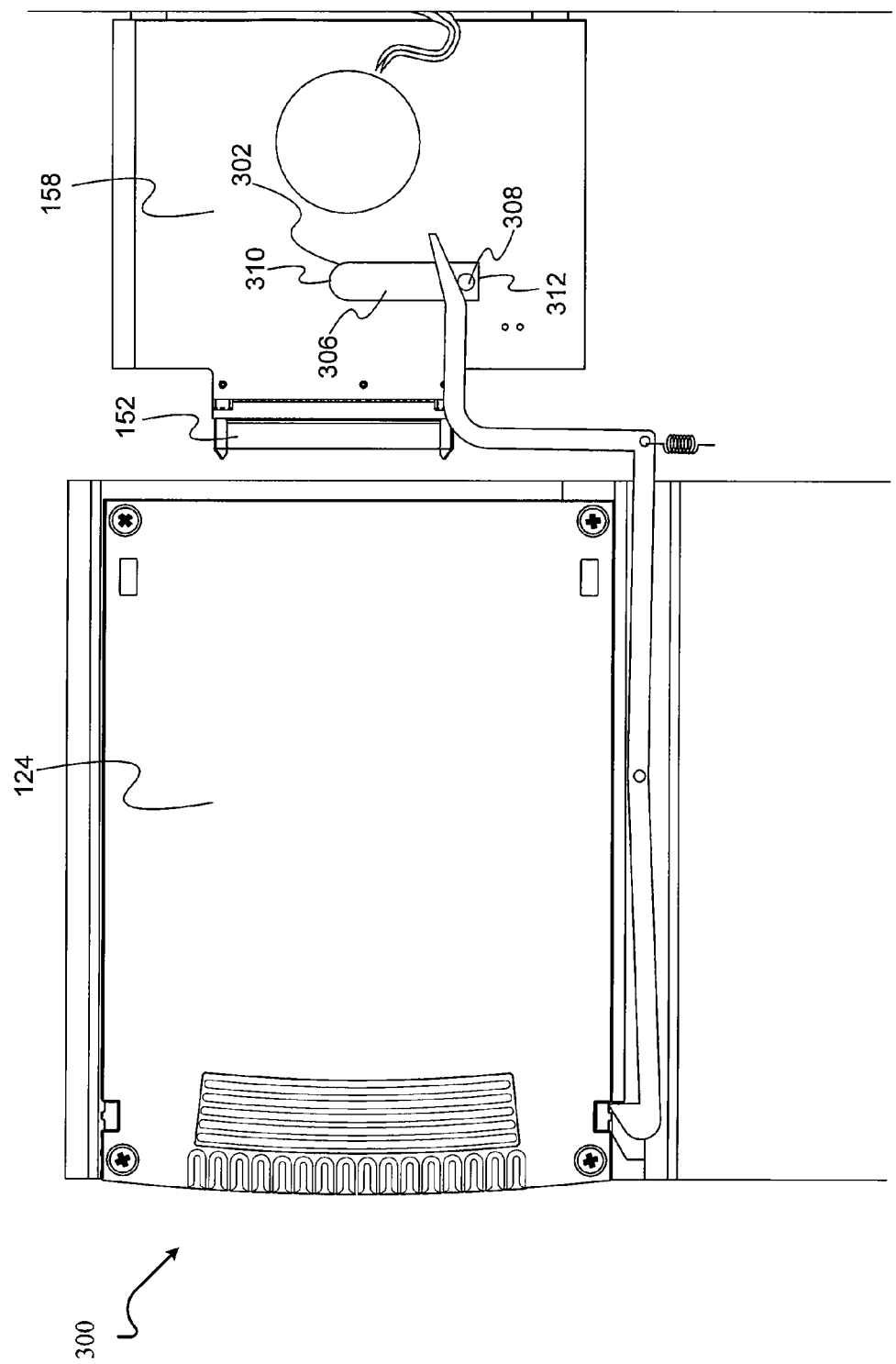

DISK LIBRARY SYSTEM INCLUDING ARRAY OF REMOVABLE DISK CARTRIDGES AND MOVABLE CONNECTOR SYSTEM

CROSS-REFERENCES TO RELATED APPLICATIONS

This application is related to commonly assigned, co-pending U.S. patent application Ser. No. 12/024,659, filed Feb. 1, 2008, and now abandoned and published as Pub. No.: US 2009/0019245 entitled "METHODS FOR IMPLEMENTATION OF DATA FORMATS ON A REMOVABLE DISK DRIVE STORAGE SYSTEM," which claims the benefit of U.S. Provisional Patent Application No. 60/959,056, filed Jul. 10, 2007, entitled "METHODS FOR IMPLEMENTATION OF DATA FORMATS ON A REMOVABLE DISK DRIVE STORAGE SYSTEM."

BACKGROUND

Large storage systems generally require several different media to store the large amounts of data. For example, to store a terabyte of data, a system needs 200 or more 500 gigabyte hard disks. With this many hard disks, numerous connections generally need to be made between the hard disks and a computer system. However, the numerous connections involve a great deal of cabling which can become intertwined and connections can become confused.

In some systems, the storage media is replaced periodically as the data on the storage media reaches capacity. Every time the storage media is replaced, the connection to the media needs to be disconnected and reconnected to the replacement media. In some situations, reconnecting the connection is difficult due to limited access to the connection on the media. The more frequent the exchanges of the media, the more problematic the changing of the connections becomes.

It is in view of these and other considerations not mentioned herein that the embodiments of the present disclosure were envisioned.

BRIEF SUMMARY

Embodiments presented herein provide a removable disk library system. The removable disk library system, in embodiments, comprises an array of removable disk drive bays and a movable connector system. Each removable disk drive bay can hold a removable disk drive cartridge. The movable connector system can be positioned behind the array of removable disk drive bays where the movable connector system can access the connector of the removable disk drive cartridges. In embodiments, the movable connector system includes a movable connector assembly that can automatically connect to the connector at the rear of the removable disk drive.

The embodiments of the removable disk library system provide several advantages. First, there may be no need for a connection for every removable disk drive. As such, the numerous cables are eliminated. Further, the removable disk drives can be replaced simply by exchanging the removable disk drives in the removable disk drive bays. With the movable connector system, no cable may need to be disconnected and reconnected. Thus, replacing the removable disk drives is simple and quick.

BRIEF DESCRIPTION OF THE DRAWINGS

The embodiments of the present disclosure are described in conjunction with the appended figures:

FIG. 3A is a perspective side-view of an embodiment of an ejection system;

Figure 1A:
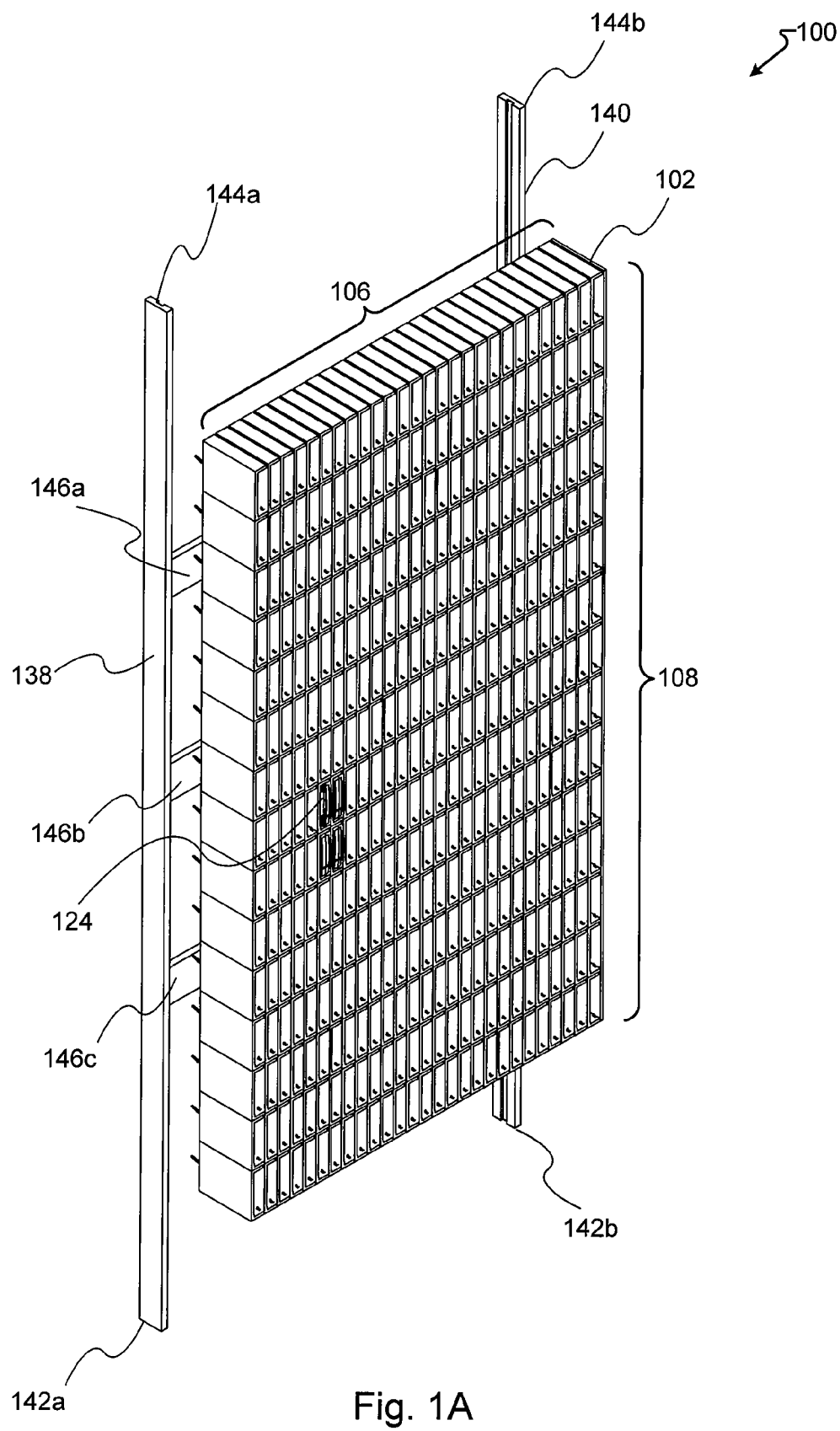
FIG. 1A is a three-dimensional view of an embodiment of a removable disk library.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The ensuing description provides exemplary embodiment(s) only and is not intended to limit the scope, applicability or configuration of the possible embodiments. Rather, the ensuing description of the exemplary embodiment(s) will provide those skilled in the art with an enabling description for implementing an exemplary embodiment. It being understood that various changes may be made in the function and arrangement of elements without departing from the spirit and scope of the possible embodiments as set forth in the appended claims.

Embodiments of the present disclosure provide a unique and novel removable disk library system. The removable disk library system may include an array of removable disk drive bays and a movable connector system. In embodiments, the removable disk drive bays form a cavity that accepts removable disk drive cartridges. The removable disk drive cartridges can be held in the removable disk drive bays with a retention system. The removable disk drive bay includes an opening at the rear of the removable disk drive bay that provides access to the connector at the rear of the removable disk drive cartridge.

The movable connector system, in embodiments, is positioned behind the array of removable disk drive bays. The movable connector system can include a movable connector assembly that moves another connector to mate with the removable disk drive cartridges. The mating connector, in embodiments, accesses the connector of the removable disk drive cartridges through the opening in the rear of the removable disk drive bay.

An embodiment of the removable disk library system 100 is shown in FIGS. 1A-1F. In embodiments, the removable disk library system 100 comprises an array 102 of two or more removable disk drive bays 104. The array 102 can be formed into one or more columns 106 of removable disk drive bays 104 and/or one or more rows 108 of removable disk drive bays 104. The array 102, in embodiments, is formed by abutting or placing the removable disk drive bays 104 in substantially close proximity to each other. In embodiments, the two or more removable disk drive bays 104 are physically attached to each other with little or no spacing between the two or more removable disk drive bays 104.

The removable disk drive bays 104 can be formed from a rigid material. In embodiments, the removable disk drive bays 104 are formed from a plastic material. In other embodiments, the removable disk drive bays 104 are formed from a metallic material, for example, aluminum or stainless steel. The removable disk drive bays 104 can include a top panel cover 110, a bottom panel floor 112, and two panel sidewalls 114 and 116. In alternative embodiments, the removable disk drive bays 118 includes only one sidewall 114, and the removable disk drive bay 104 is enclosed by abutting the open side to the sidewall 116 of an adjacent removable disk drive bay 120. The top panel cover 110, a bottom panel floor 112, and two panel sidewalls 114 and 116 can form a cavity 122 that accepts a removable disk drive cartridge 124.

The top panel cover 110, a bottom panel floor 112, and two panel sidewalls 114 and 116 also form an opening 126 in the rear 128 of the removable disk drive bay 104. The opening 126 provides access to the connector (not shown) that is at the rear of the removable disk drive cartridge 124. The opening 126 can be smaller or larger than that shown in FIG. 1B. The opening 126, in embodiments, is large enough to allow a mating connector (not shown) to pass through the opening 126 to mate with the connector (not shown). The removable disk drive bay 104, in embodiments, also comprises a back panel 134. The back panel 134 can have the opening 126 formed into a portion of the back panel 134.

In embodiments, the removable disk drive bays 104 are placed and are physically coupled to a stand that anchors the removable disk drive bays 104 to the floor. In other embodiments, the removable disk drive bays 104 are set upon the floor with or without an anchor system. In still another embodiment, the removable disk drive bays 104 are placed in an enclosure such as a cabinet. The each of the removable disk drive bays 104 has a set position that can be determined. For example, the removable disk drive bay 120 has a position that is a determinable distance horizontally from a predetermined location and a determinable distance vertically from the floor. The determinable distance can be used to locate the connector on the rear of the removable disk drive cartridge. In embodiments, the determinable distance is predetermined from a location on the removable disk library system 100.

A second component of the removable disk library system 100 is the movable connector system 136. In embodiments, the movable connector system 136 is an X-Y-Z movement system. The movement of any one of the components may be accomplished using a rack and pinion system, a cable and pulley system, a lead screw, a servomotor, or other various electromechanical systems. Embodiments of the movable connector system 136 includes one or more components that provide a movable connector 150 that mates with the connector on the back of the removable disk drive cartridge 124. In one embodiment, the movable connector system 136 comprises a first member 138, a second member 140, and one or more movable armatures 146.

The first member 138 and the second member 140, in embodiments, are made from a rigid material, for example, a plastic or metal. In one embodiment, the first member 138 and the second member 140 are made from aluminum or stainless steel. In embodiments, the first member 138 and the second member 140 are a beam approximately 4 inches wide, one half inch thick, and eight feet long. These dimensions are only an example of possible dimensions for the first member 138 and the second member 140. One skilled in the art will recognize other possible dimensions for the first member 138 and the second member 140 that are within the scope of the disclosure. The first member 138 and the second member 140 can each create a rail that allows a movable armature 146 to move vertically (along the Y-axis).

Figure 1B:
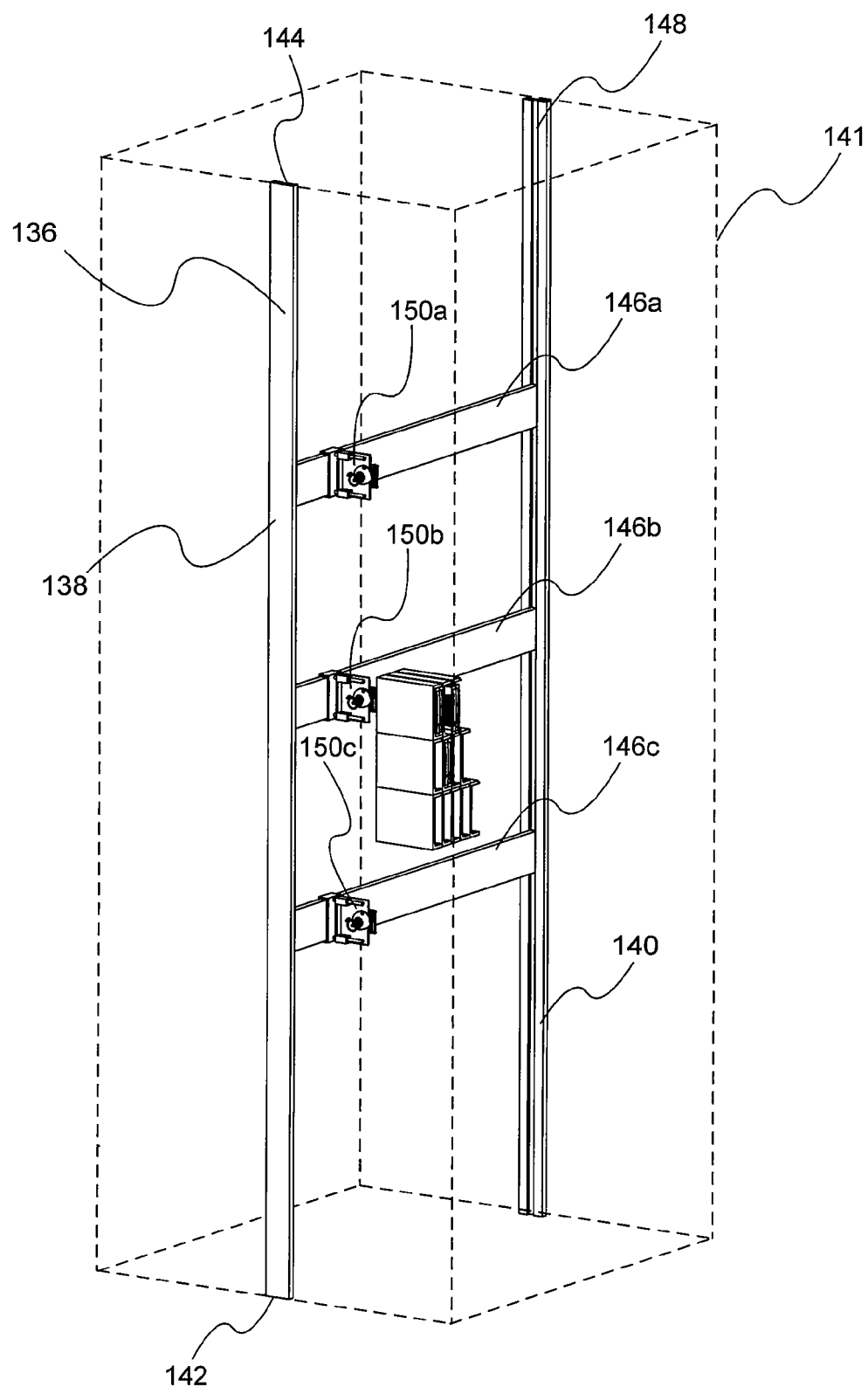
FIG. 1B is another three-dimensional view of an embodiment of a removable disk library showing an embodiment of the movable connector system.

The first member 138 and the second member 140 can have a first end 142 and a second end 144. The first end 142 may be connected to the floor by a base, stand, or other fastener (not shown). In embodiments, the first member 138 and the second member 140 are oriented vertically such that the first end 142 is generally positioned near the floor and the second end 144 is elevated from the floor. The first member 138 and the second member 140 are, in embodiments, substantially perpendicular (that is, the first member 138 and the second member 140 may not be exactly perpendicular) to the plane of the floor. The first member 138 and the second member 140 are oriented behind the array 102 and substantially parallel to the array 102, as shown in FIG. 1A. Further, the first member 138 can be positioned substantially parallel to second member 140, as shown in FIG. 1B.

In embodiments, one or more movable armatures 146 are movably connected to the first member 138 and the second member 140. The movable armature 146 may be movably connected by allowing the movable armature 146 to move vertically along each of the first member 138 and the second member 140. In embodiments, the first member 138 and the second member 140 include a channel 148 that allows the movable armature 146 to be guided along the first member 138 and the second member 140.

In alternative embodiments, the movable connector system 136 also includes a brace connected to the first member 138 and the second member 140. The brace may span the distance between the first member 138 and the second member 140 and provide support for the first member 138 and the second member 140. The brace may be positioned at any location along the first member 138 and the second member 140 that does not interfere with the operation of the movable connector system 136. The brace can maintain the vertical positioning of the first member 138 and the second member 140 and maintain the parallel orientation of the first member 138 and the second member 140. In other embodiments, the brace is the structure of a cabinet 141 that provides structural rigidity to the first member 138 and the second member 140.

The movable connector system 136 can also comprise a movable connector assembly 150 that is movably connected to the movable armature 146. The movable connector assembly 150 provides the horizontal movement (in the X-axis) for the movable connector 150. In embodiments, a controller positions the movable connector assembly 150 along the Y-axis and the X-axis to position the connector 152 behind the connector of the removable disk drive cartridge 124. The connector 152 may then engage the removable disk drive cartridge 124.

Figure 1C:
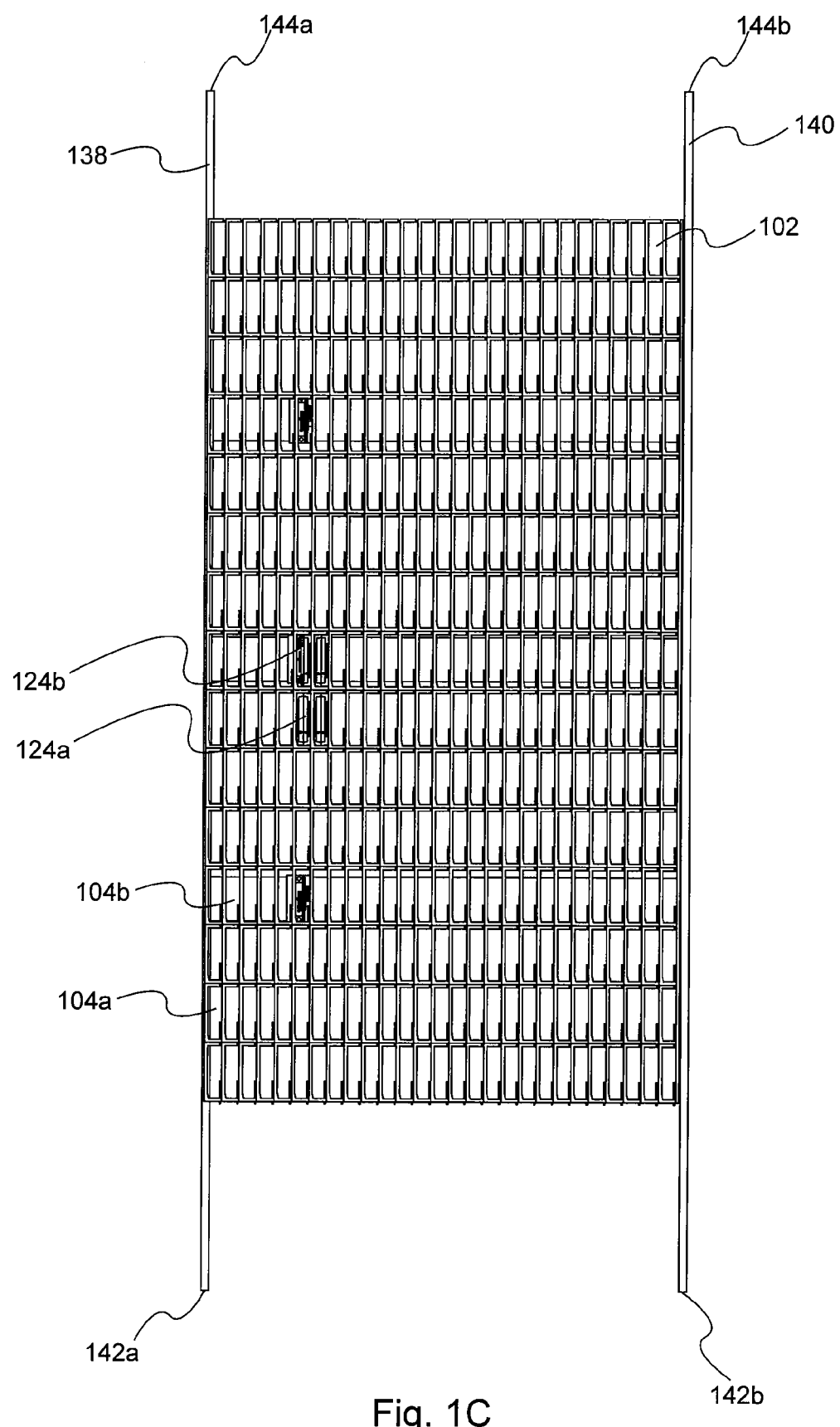
FIG. 1C is a front perspective view of an embodiment of a removable disk library
Figure 1D:
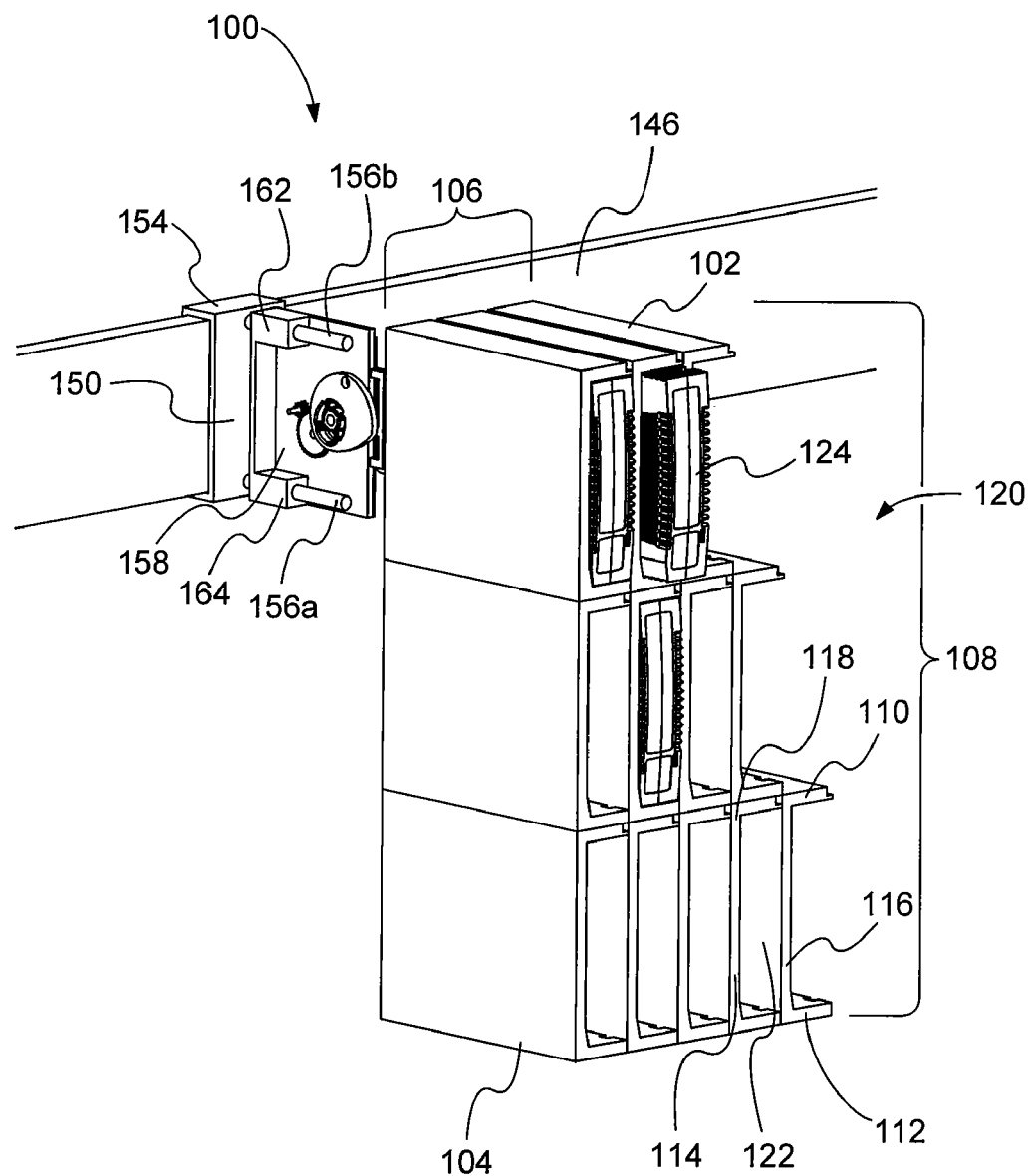
FIG. 1D is an enlarged three-dimensional view of a portion of an embodiment of a removable disk library.
Figure 1E:
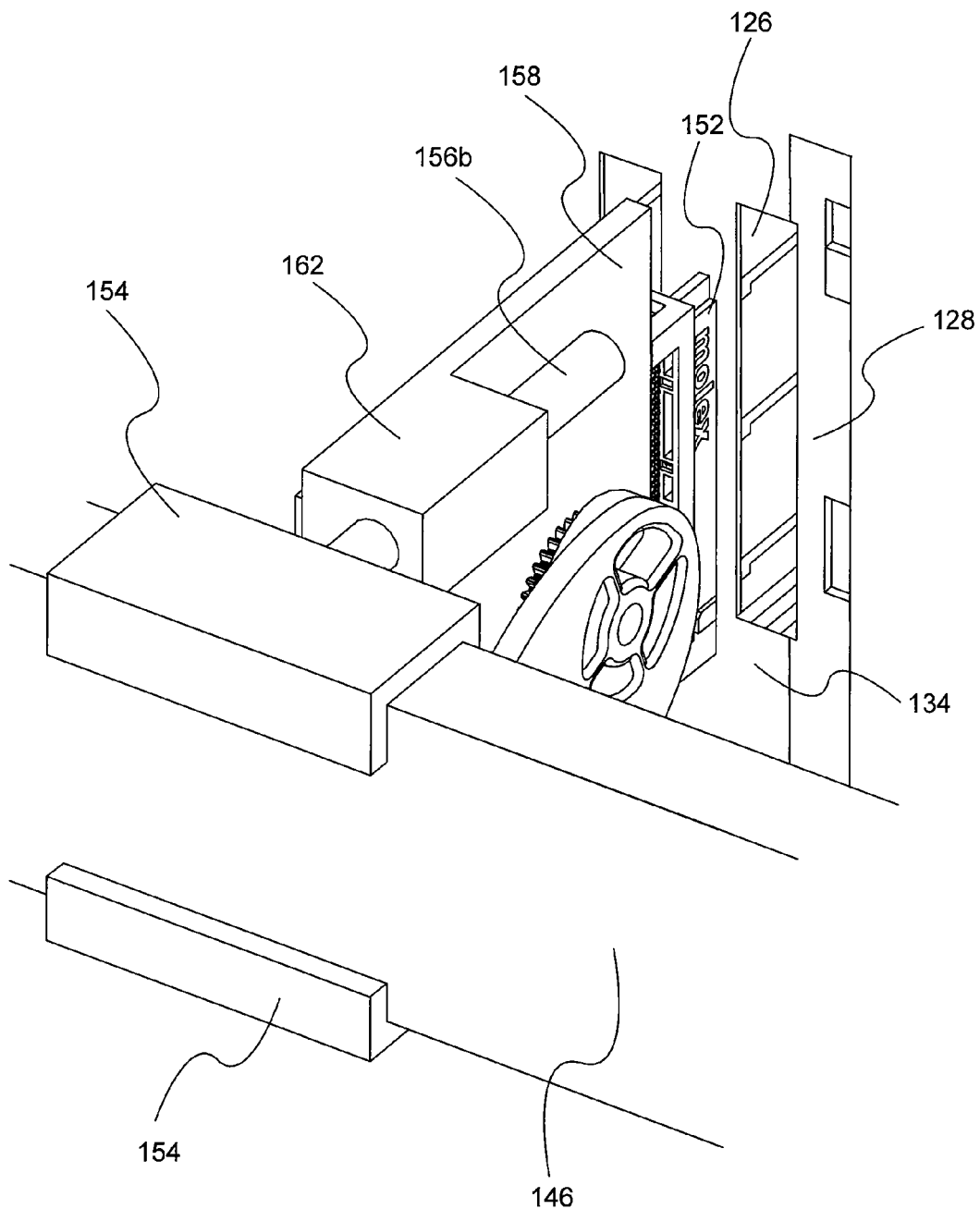
FIG. 1E is an enlarged three-dimensional view of a rear portion of an embodiment of a removable disk library showing an embodiment of the movable connector.
Figure 1F:
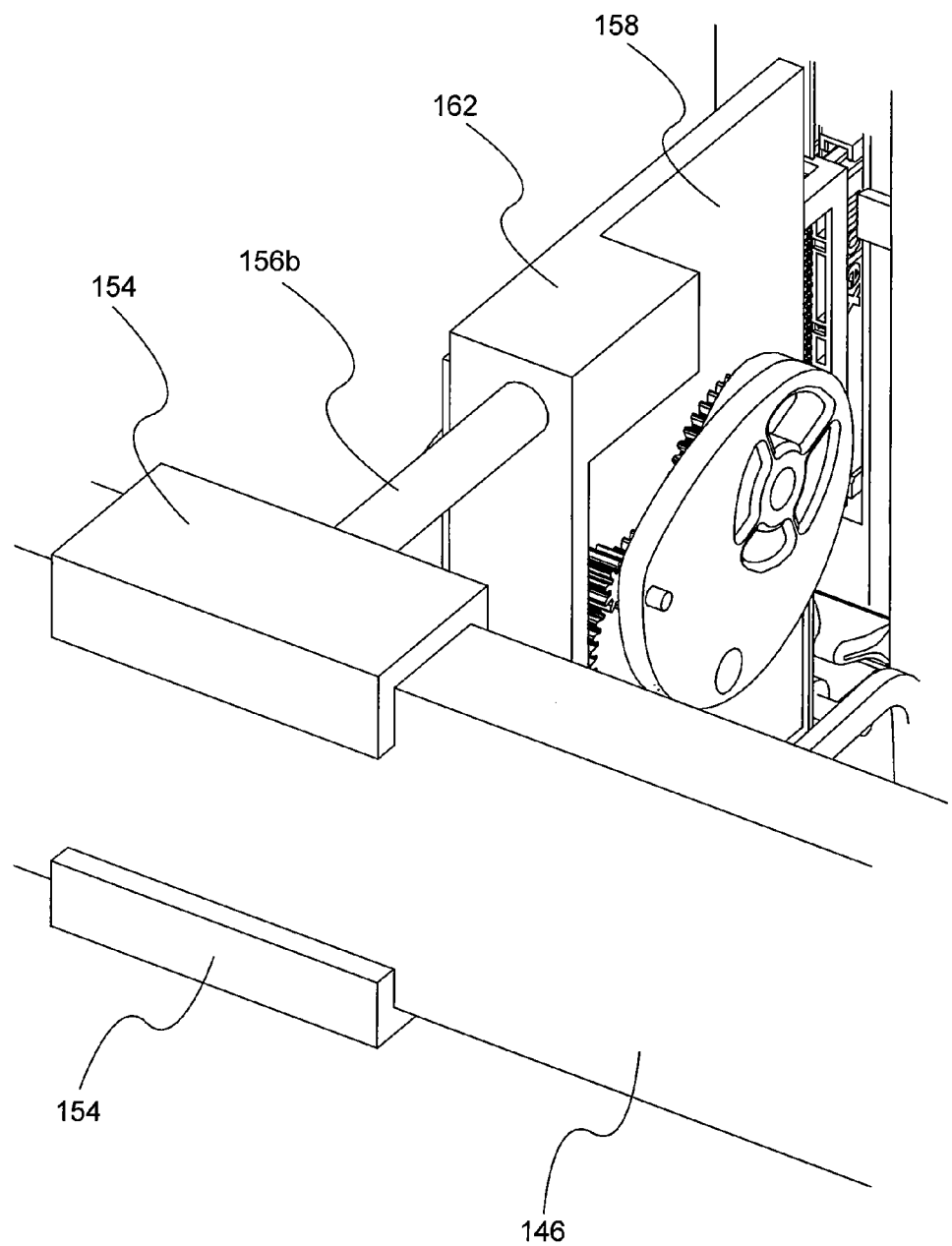
FIG. 1F is an enlarged three-dimensional view of a rear portion of an embodiment of a removable disk library showing an embodiment of the movable connector mated with the connector of a removable disk cartridge.

One embodiment of the movable connector assembly 150 is shown in FIGS. 1D through 1F. In embodiments, the movable connector assembly 150 comprises a base 154, one or more lead screws 156, a platform 158, and a connector 152. In embodiments, the base 154 is movably connected to an movable armature 146. The base 154 moving along the movable armature 146 provides the horizontal (in the X-axis) movement. The base 154 can be made of a rigid material, for example, a composite, a plastic, a metal, etc. The base 154 may be formed circumferentially around the movable armature 146 to couple the base 154 to the movable armature 146. In embodiments, the base 154 may have a coating or be made of a material with a low coefficient of friction to allow the base 154 to more easily slide along the movable armature 146.

In embodiments, the one or more lead screws 156 are physically coupled to a first end 162 attached to the base 154. The one or more lead screws 156 can also be made of a rigid material, for example, a composite, a plastic, a metal, etc. The one or more lead screws (also referred to as posts) extend from the base 154 and span a predetermined distance between the base 154 and a back of an array 102 of removable disk drive bays 104. The predetermined distance is determined by the amount of movement in the Z-axis needed for the connector 152 to engage the connector on the back of the removable disk drive cartridge 124. As such, the distance is variable and can be set according to the needs of the user. The one or more lead screws 156 can rotate allowing a threaded portion 164 of the platform 158 to move horizontally and perpendicular to the movable armature 146.

The platform 158, in embodiments, is movably connected to the one or more lead screws. The platform 158 can also be made of a rigid material, for example, a composite, a plastic, a metal, etc. In embodiments, the platform 158 has an area large enough to span the distance between the one or more lead screws 156 and large enough to provide one or more attachment points for the connector 152. The movement along the one or more lead screws 156 allows the platform 158 to provide the Z-axis movement to engage the connector 152 to the connector on the back of the removable disk drive cartridge 124.

The movable connector assembly 150 also includes a connector 152, also referred to as the movable connector 152. The connector 152 is any connector that is suitable to couple or mate with the connector (not shown but in the opening 126) on the back of the removable disk drive cartridge 124. In embodiments, the connector 152 is the male connector that mates with the female connector on the removable disk drive cartridge 124. The movable connector assembly 150 can also include a wire connected to the connector 152 and/or one or more components of the movable connector assembly 150. In embodiments, the connector 152 and cable 166 (see FIG. 2) provide the electrical connection from the removable disk drive cartridge 124 to a system controller, server, router, or other system component for retrieving data from or storing data to the removable disk drive cartridge 124. In embodiments, the cable 166 is attached at one end to the connector 152 and to another component, such as a disk drive interface, at the other end.

An embodiment of a retention system 200 (and an embodiment of an eject system) is shown in FIGS. 2 and 3A-3E. The retention system 200 is a mechanical system that holds or physically secures the removable disk drive cartridge 124 (FIGS. 1C-D) in the removable disk drive bay 104 (FIGS. 1C-D). In embodiments, the retention system 200 comprises a lever 202 and a spring 204. The lever 202 can be made from a rigid material, for example, a composite, a plastic, a metal, etc. The material can be strong enough to ensure proper retention of the removable disk drive cartridge 124 with little wear or breaking. The lever 202, in embodiments, is rotatably attached to the bottom of the removable disk drive bay 104 (FIGS. 1C-D) be a pivot 206. Therefore, the lever 202 has a first end 208 and a second end 210 that move vertically in opposite directions while rotating at the pivot 206.

The first end 208 of the lever 202 can include a detent 212. The detent 212, in embodiments, comprises a beveled edge 214 and a perpendicular surface 216. When a removable disk drive cartridge 124 is inserted into the removable disk drive bay 104 (FIGS. 1C-D), the removable disk drive cartridge 124 slides over the beveled edge while being inserted. The removable disk drive cartridge 124 can include an indention 218. When the indention 218 of the removable disk drive cartridge 124 reaches the detent 212, the detent 212, in embodiments, engages the indention 218 by moving vertically into the indention 218. When in the indention 218, the perpendicular surface 216 can physically touch one of the inside walls of the indention 218. The shape of the detent 212 and the perpendicular surface 216 can prevent the removable disk drive cartridge 124 from being accidentally pushed from the removable disk drive bay 104 (FIGS. 1C-D).

The second end 210 of the lever 202 can include a lever flange 220. The lever flange 220 can extend from the back of the removable disk drive bay 104 (FIGS. 1C-D) from some predetermined distance. When the lever flange 220 moves vertically, the detent 212 is disengaged from the indention 218. Therefore, the spring 204, at a first end, is attached to the second end 210 of the lever 202 and, at a second end 210, to some fixed point on the rear of the removable disk drive bay 104 (FIGS. 1C-D). The spring 204 can keep the detent 212 engaged with the indention 218 by exerting a force downward, through compression, against the second end 210 of the lever 202. When disengaged, another counter force extends the spring 204 to disengage the lever 202.

To disengage the spring 204 on the rear of the removable disk drive bay 104 (FIGS. 1C-D), the movable connector assembly 150 (FIGS. 1D-1F), in embodiments, includes a novel eject system 300 shown in FIGS. 2 and 3A through 3E. The eject system 300 can include a release flange 302 and a cam 304. The release flange 302 and the cam 304 are attached to an axle interposed in the platform 158 (FIGS. 1E-1F) of the movable connector assembly 150 (FIGS. 1D-1F). The release flange 302 is attached to one end of the axle on one side of the platform 158 (FIGS. 1E-1F) and the cam 304 is attached to the other end of the axle on the other side of the platform 158 (FIGS. 1E-1F). When the axle is rotated, the release flange 302 disengages the lever detent 212 while the cam 304 rotates to extend beyond the connector on the platform 158 (FIGS. 1E-1F). Thus, as the platform 158 (FIGS. 1E-1F) moves in the Z-axis direction, the cam 304 contacts the rear of the removable disk cartridge and pushes the removable disk cartridge from the removable disk drive bay 104 (FIGS. 1C-D).

Figure 2:
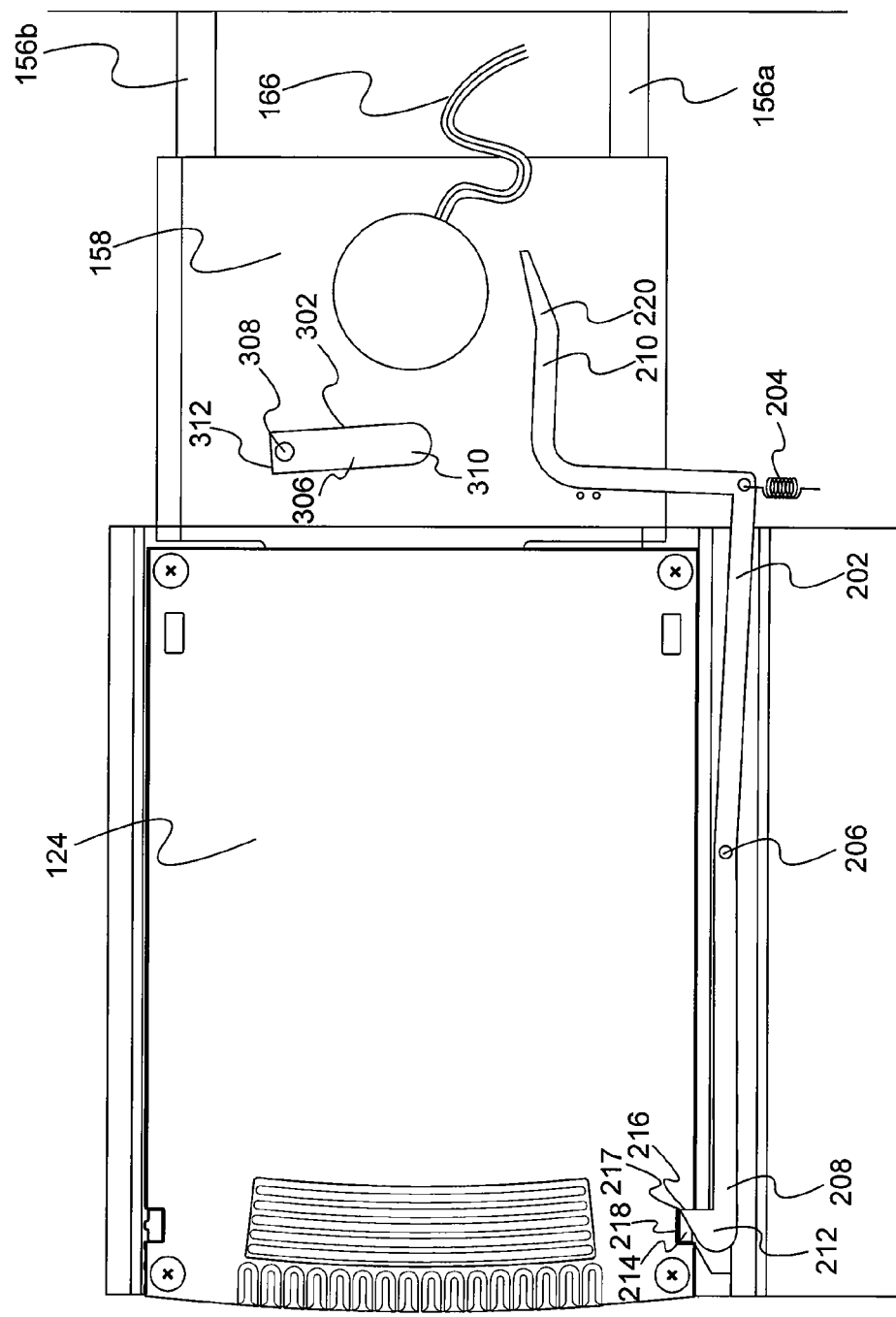
FIG. 2 is a perspective side-view of an embodiment of a retention system.

The release flange 302 can comprise a flange 306 and a post 308. The components of the release flange 302 can be made from a rigid material, for example, a composite, a metal, a plastic, etc. The flange 306 is rotatably attached to the axle at a first end 310. In embodiments, the attachment to the axle creates a pivot upon which the flange 306 rotates in a clockwise direction. At the second end 312, the post 308 can extend from the flange 306. The length of the post 308 is dependent on the distance between the platform 158 (FIGS. 1E-1F) and the lever. The post 308, in embodiments, has a length sufficient to disengage the lever 202 (FIG. 2) when touching the lever 202 (FIG. 2). The flange 306 is shown in the inactive position in FIG. 2. The flange 306 is shown in the engaged position in FIGS. 3A and 3D. In embodiments, the flange 306 is rotated into position before the movable connector assembly 150 (FIGS. 1D-1F) extends in the Z-axis direction. As the movable connector assembly 150 (FIGS. 1D-1F) extends in the Z-axis direction, the post contacts the beveled edge 216 (FIG. 2) of the lever 202 (FIG. 2). As the movable connector assembly 150 (FIGS. 1D-1F) moves, the cam 304 continues along the beveled edge 216 (FIG. 2) and then further down the lever 202 (FIG. 2). The force on the beveled edge 216 (FIG. 2) causes the lever end to move vertically, and thus, disengage the detent 212 (FIG. 2) as explained above.

Figure 3B:
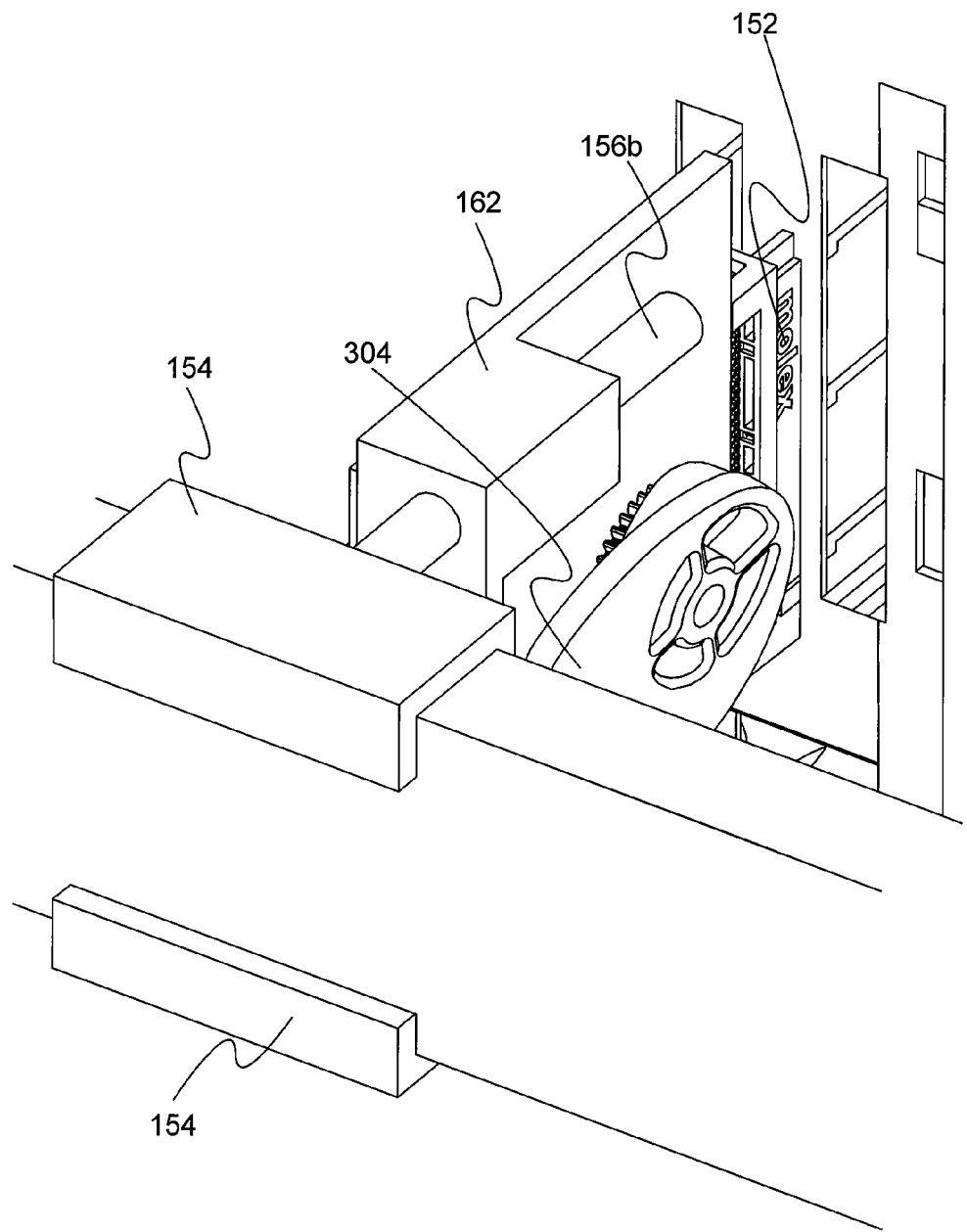
FIG. 3B is an enlarged three-dimensional view of a rear portion of an embodiment of a removable disk library showing an embodiment of the movable connector.
Figure 3C:
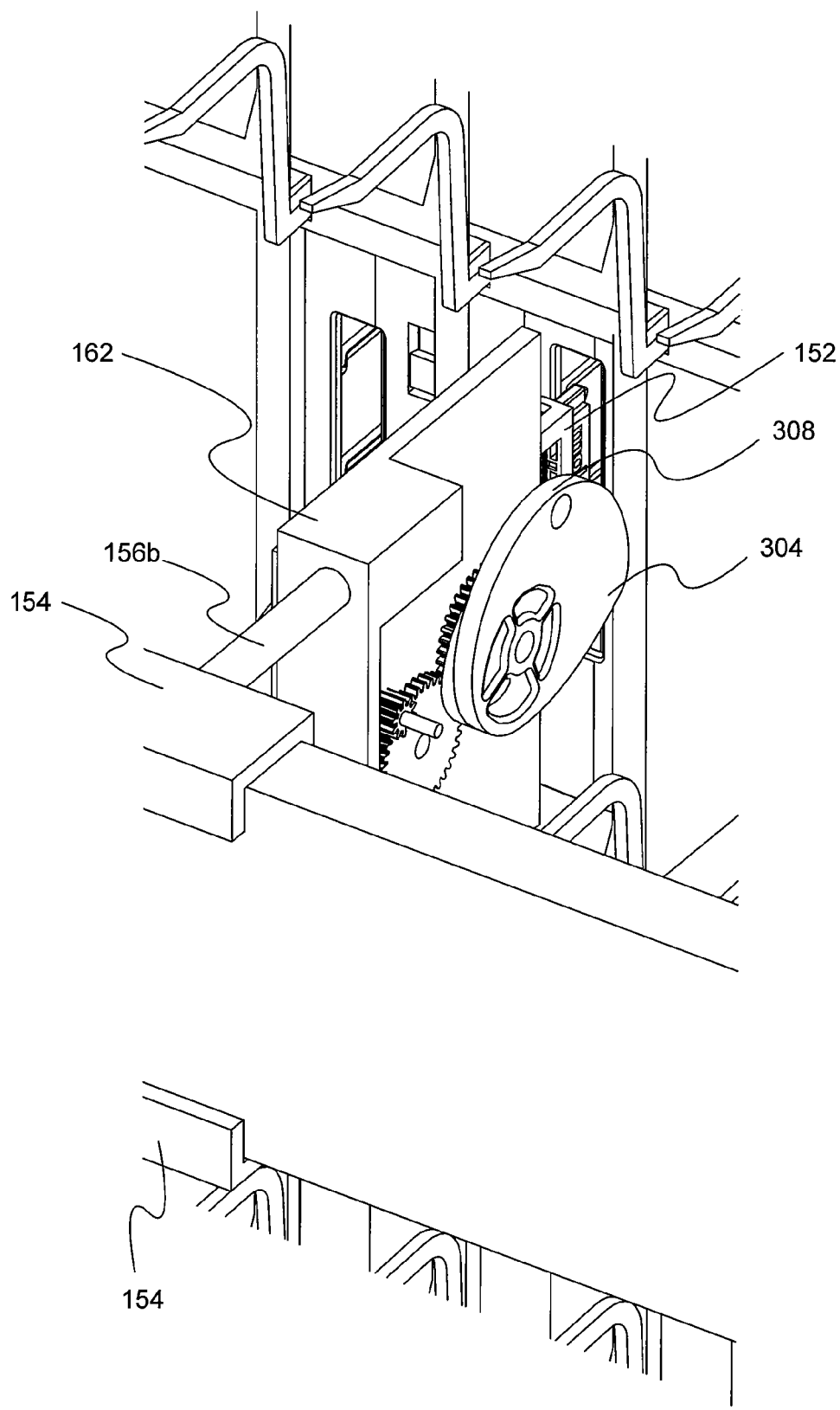
FIG. 3C is an enlarged three-dimensional view of a rear portion of an embodiment of a removable disk library showing an embodiment of the ejection system engaged to eject a removable disk cartridge.
Figure 3D:
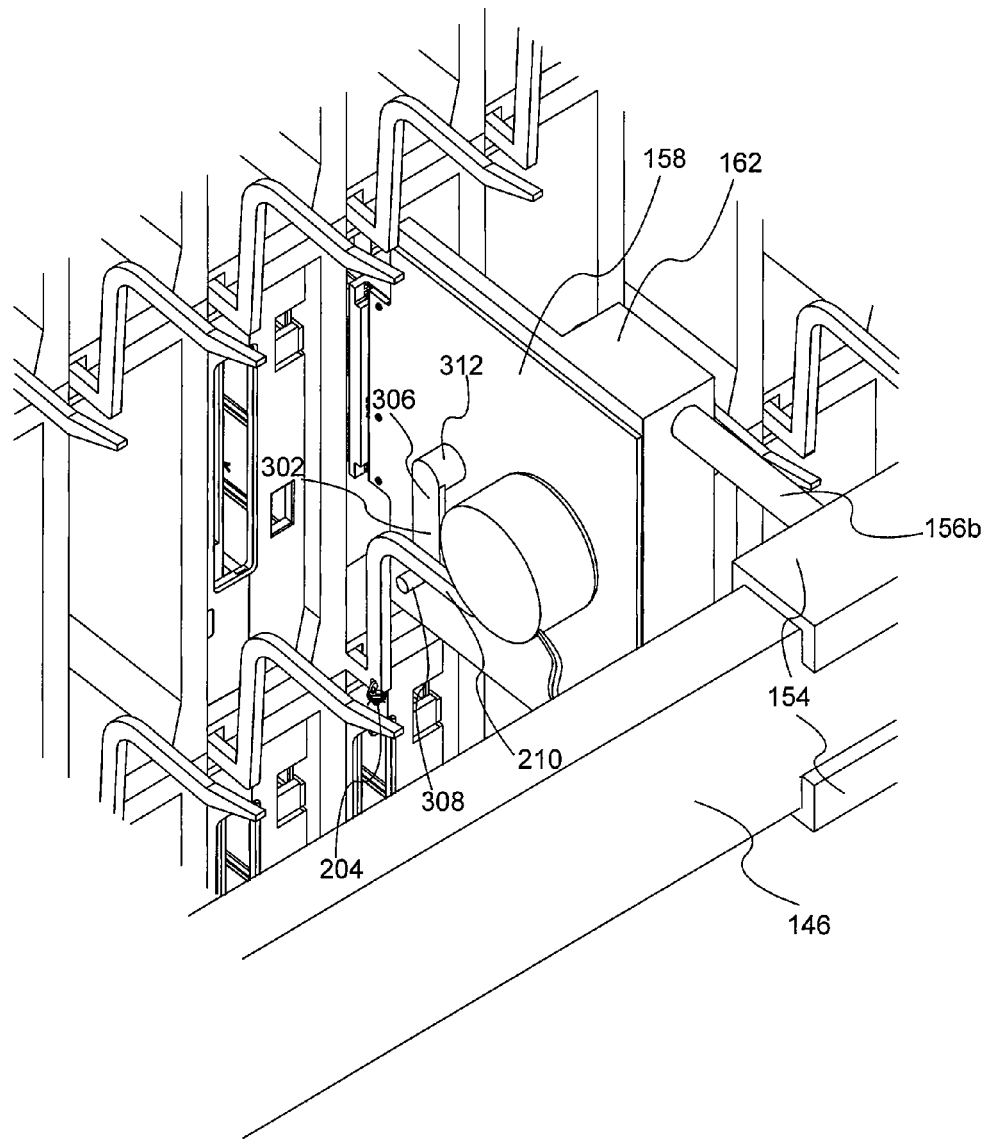
FIG. 3D is another enlarged three-dimensional view of a rear portion of an embodiment of a removable disk library showing an embodiment of the ejection system ejecting a removable disk cartridge.
Figure 3E:
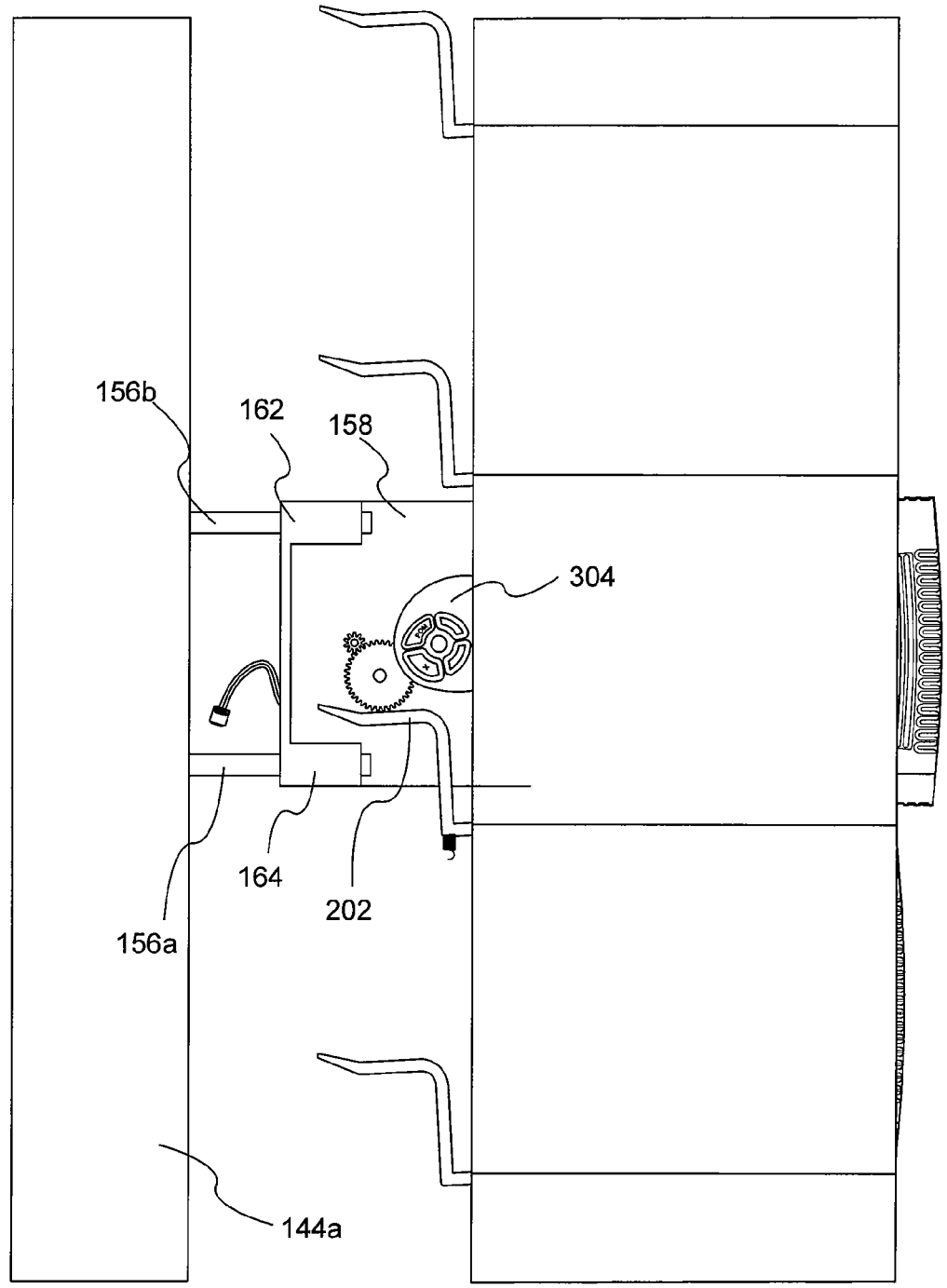
FIG. 3E is a perspective side view of an embodiment of a removable disk library showing an embodiment of the ejection system ejecting a removable disk cartridge.

The cam 304 can be rotatably connected to the axle. In embodiments, the cam 304 has a gradually increasing radius with the connection to the axle at one end of the cam 304. When rotated, the cam 304 extends beyond the connector 152, as shown in FIGS. 3C and 3E. As such, when the movable connector assembly 150 (FIGS. 1D-1F) extends in the Z-axis direction, the cam 304 contacts the rear of the removable disk cartridge before the connector 152 mates with the connector on the removable disk cartridge. As the movable connector assembly 150 (FIGS. 1D-1F) extends in the Z-axis direction, the cam 304 pushes the removable disk cartridge from the removable disk drive bay 104 (FIGS. 1C-D) some predetermined distance. The removable disk cartridge will extend some distance beyond the cavity of the removable disk drive bay 104 (FIGS. 1C-D) and allow a person to extract the removable disk cartridge.

Figure 4:
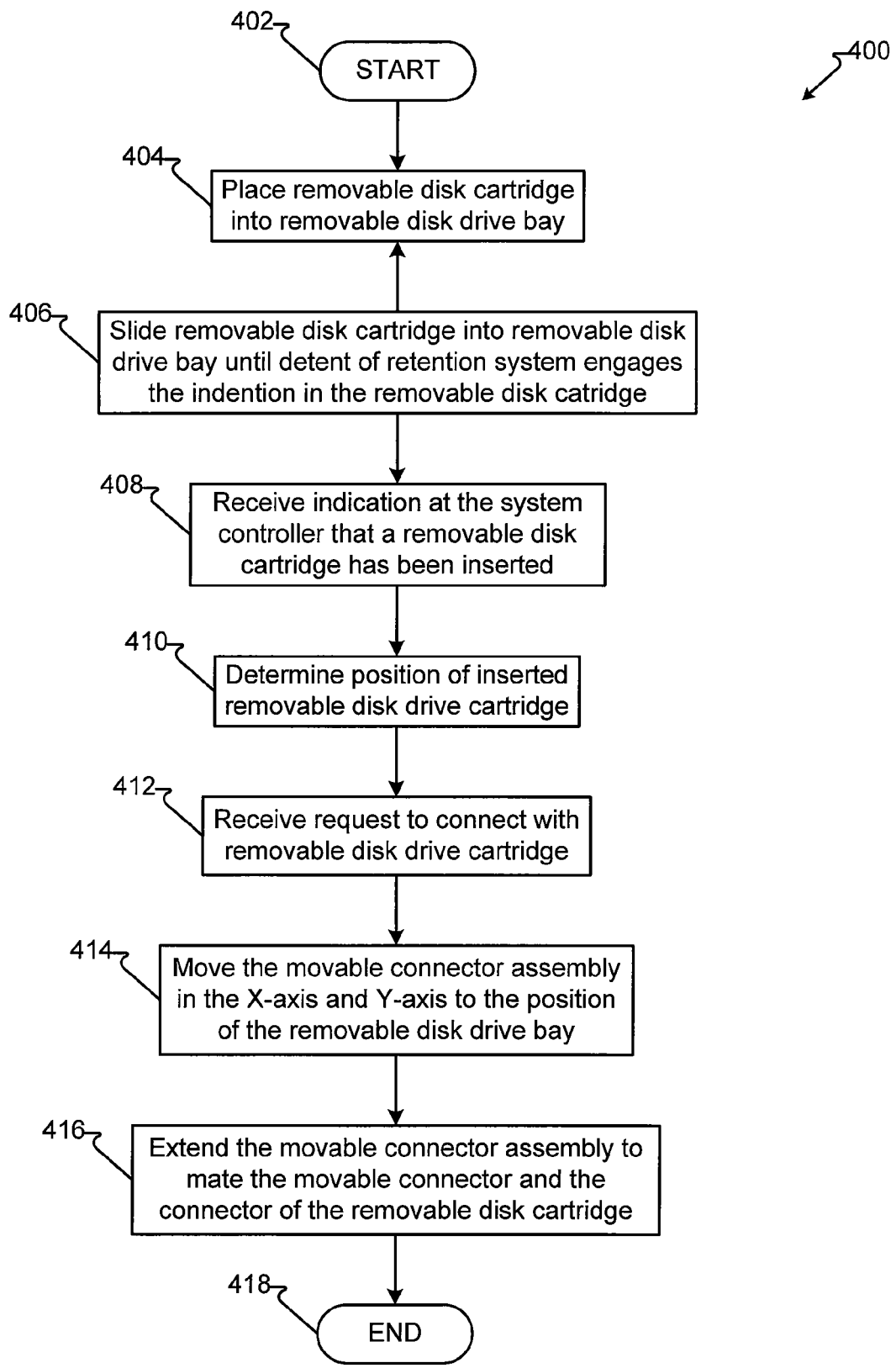
FIG. 4 is a flow diagram showing an embodiment of a method for inserting a removable disk cartridge into a removable disk library and connecting a movable connector.

An embodiment of a method 400 for inserting and connecting a removable disk cartridge is shown in FIG. 4. In embodiments, the method 400 generally begins with a START operation 402 and terminates with an END operation 418. One or more of the steps shown in the method 400 may be executed in a computer system as a set of computer executable instructions. While a logical order is shown in FIG. 4, the steps shown or described can, in some circumstances, be executed in a different order than presented herein.

Place operation 404 places a removable disk cartridge in a removable disk drive bay 104 (FIGS. 1C-1D). In embodiments, a person places a removable disk cartridge into a removable disk drive bay 104 (FIGS. 1C-1D) of the library. Slide operation 406 slides the removable disk cartridge further into the removable disk drive bay 104 (FIGS. 1C-1D). In embodiments, a person pushes the removable disk cartridge into the removable disk drive bay 104 (FIGS. 1C-1D). The removable disk cartridge slides through the cavity of the removable disk drive bay 104 (FIGS. 1C-1D) until the detent 212 (FIG. 2) on the lever 202 (FIG. 2) of the retention system engages the indention on the removable disk cartridge. Once the retention system 200 (FIG. 2) is engaged, the removable disk cartridge is fully inserted.

Receive operation 408 receives an indication that the removable disk cartridge has been inserted. In embodiments, the removable disk drive bay 104 (FIGS. 1C-1D) includes a sensor that sends a signal to a system controller indicating that a removable disk cartridge has been inserted. In other embodiments, the user interacts with a user interface of a computer system that is in communication with the system controller. The user enters an indication that the removable disk cartridge has been inserted.

Determine operation 410 determines the position, in the X-axis and the Y-axis, of the removable disk drive bay 104 (FIGS. 1C-1D). The removable disk drive bay 104 (FIGS. 1C-1D) may communicate with the system controller to provide an identifier or a position for the removable disk drive bay 104 (FIGS. 1C-1D). In other embodiments, the user interacts with the user interface of the system controller to enter the identifier or position. The system controller can receive the identifier. In embodiments, the system controller stores a database associating identifiers and the positions of the removable disk drive bays 104 (FIGS. 1C-1D). The system controller can determine the position of the removable disk drive bay 104 (FIGS. 1C-1D) by searching for the identifier in the database and retrieving an associated position of the removable disk drive bay 104 (FIGS. 1C-1D).

Receive operation 412 receives a request to connect with the inserted removable disk cartridge. In embodiments, a storage system sends, and the system controller receives, a request to physically connect the removable disk cartridge to allow for storage or retrieval of data onto the removable disk cartridge. The system controller retrieves the position of the removable disk drive bay 104 (FIGS. 1C-1D).

Move operation 414 moves the movable connector assembly 150 (FIGS. 1D-1F) to the X-axis and Y-axis positions associated with the position of the removable disk drive bay 104 (FIGS. 1C-1D) determined by the system controller. In embodiments, the system controller sends one or more control signals to the movable armature 146 (FIGS. 1A-1F) to move to a predetermined Y-axis position along the vertical members. Likewise, the system controller sends one or more control signals to the movable connector assembly 150 (FIGS. 1D-1F) to move to a predetermined X-axis position along the movable armature 146 (FIGS. 1A-1F).

Extend operation 416 extends the movable connector system to mate the movable connector 152 with the connector on the rear of the removable disk cartridge. In embodiments, the system controller sends one or more control signals to the platform 158 (FIGS. 1E-1F) to extend in the Z-axis. The platform extends for some predetermined distance to mate the connectors.

Figure 5:
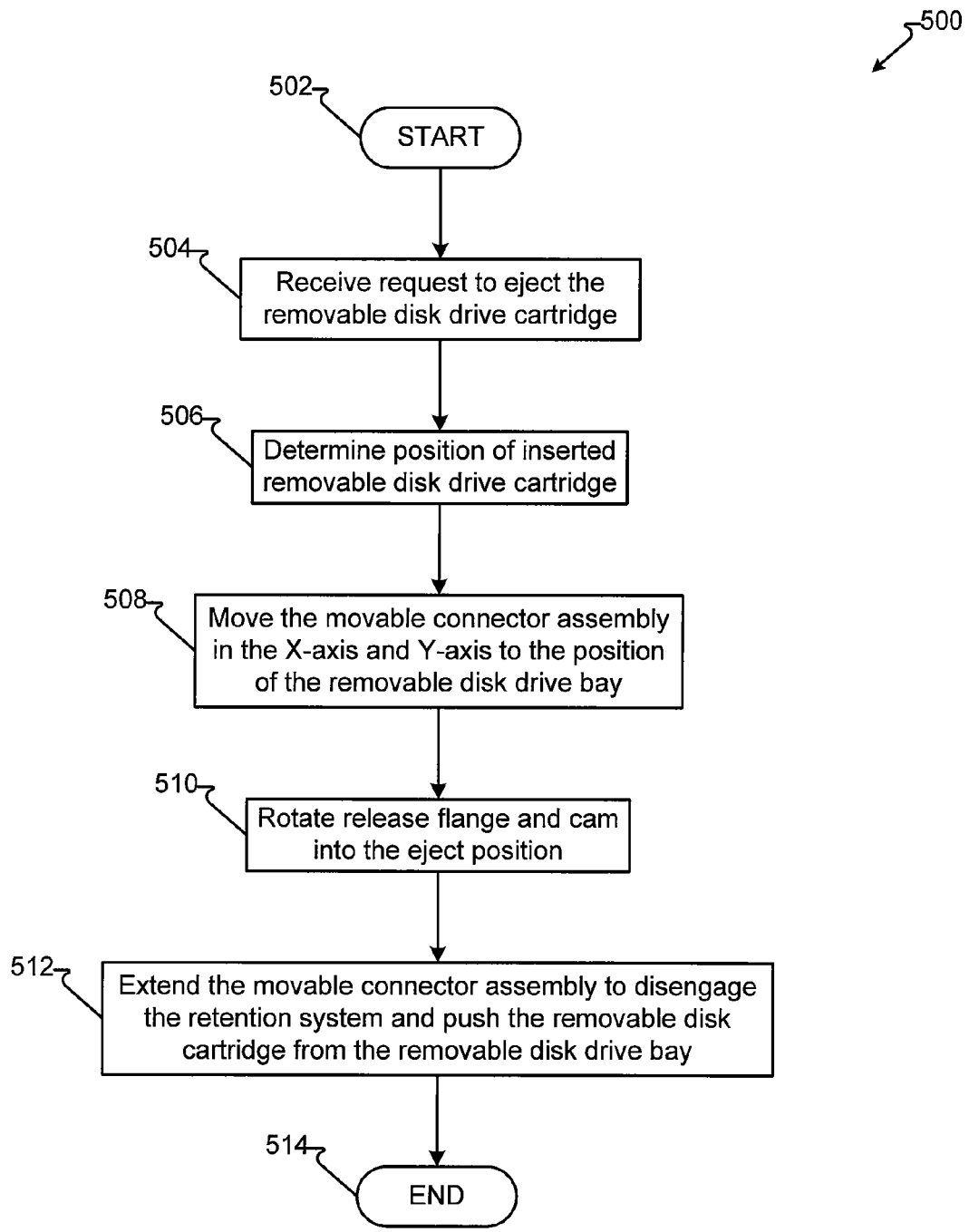
FIG. 5 is a flow diagram showing an embodiment of a method for ejecting a removable disk cartridge from a removable disk library.

An embodiment of a method 500 for inserting and connecting a removable disk cartridge is shown in FIG. 5. In embodiments, the method 500 generally begins with a START operation 502 and terminates with an END operation 514. One or more of the steps shown in the method 500 may be executed in a computer system as a set of computer executable instructions. While a logical order is shown in FIG. 5, the steps shown or described can, in some circumstances, be executed in a different order than presented herein.

Receive operation 504 receives a request to eject a removable disk cartridge from a predetermined removable disk drive bay 104 (FIGS. 1C-1D). In embodiments, a storage system sends a request to eject the removable disk cartridge. The storage system may send an identifier for the removable disk cartridge. In other embodiments, a user interacts with a user interface to a computer system in communication with a system controller. The user may enter the request for the ejection and/or the identifier for the removable disk cartridge. The system controller can receive the identifier.

Determine operation 506 determines the position of the removable disk drive bay 104 (FIGS. 1C-1D) containing the removable disk cartridge. In embodiments, the system controller stores a database associating identifiers and the positions of the removable disk drive bays 104 (FIGS. 1C-1D). The system controller can determine the position of the removable disk drive bay 104 (FIGS. 1C-1D) by searching for the identifier in the database and retrieving an associated position of the removable disk drive bay 104 (FIGS. 1C-1D). In other embodiments, the storage system or the user provides the position of the removable disk drive bay 104 (FIGS. 1C-1D).

Move operation 508 moves the movable connector assembly 150 (FIGS. 1D-1F) to the X-axis and Y-axis positions associated with the position of the removable disk drive bay 104 (FIGS. 1C-1D) determined by the system controller. In embodiments, the system controller sends one or more control signals to the movable armature 146 (FIGS. 1A-1F) to move to a predetermined Y-axis position along the vertical members. Likewise, the system controller sends one or more control signals to the movable connector assembly 150 (FIGS. 1D-1F) to move to a predetermined X-axis position along the movable armature 146 (FIGS. 1A-1F).

Rotate operation 510 rotates the eject system. In embodiments, the system controller sends one or more control signals to the movable connector assembly 150 (FIGS. 1D-1F) to rotate the axle of the eject system 300 (FIGS. 3A-3E). The release flange 302 and the cam 304 of the eject system 300 (FIGS. 3A-3E) rotate into the eject position.

Extend operation 512 extends the movable connector system to eject the removable disk cartridge. In embodiments, the system controller sends one or more control signals to the platform 158 (FIGS. 1E-1F) to extend in the Z-axis. The platform 158 (FIGS. 1E-1F) extends for some predetermined distance. The release flange 302 engages the lever 202 (FIG. 2) and moves the second end of the lever 210 (FIG. 2) vertically. The detent 212 (FIG. 2) on the other end of the lever 210 (FIG. 2) disengages the indention 218 (FIG. 2) in the removable disk cartridge. After the retention system is disengaged, the cam 304 can contact the back of the removable disk cartridge. As the movable connector system 150 extends in the Z-axis, the cam 304 pushes the removable disk cartridge from the removable disk drive bay 104 (FIGS. 1C-1D). A user may then grab the front of the removable disk cartridge to extract the removable disk cartridge.

While various aspects of embodiments of the disclosure have been summarized above, the following detailed description illustrates exemplary embodiments in further detail to enable one of skill in the art to practice the disclosure. In the following description, for the purposes of explanation, numerous specific details are set forth in order to provide a thorough understanding of the present disclosure. It will be apparent, however, to one skilled in the art that the present disclosure may be practiced without some of these specific details. In other instances, well-known structures and devices are shown in block diagram form. Several embodiments of the disclosure are described below, and while various features are ascribed to different embodiments, it should be appreciated that the features described with respect to one embodiment may be incorporated with another embodiment as well. By the same token, however, no single feature or features of any described embodiment should be considered essential to the disclosure, as other embodiments of the disclosure may omit such features.

Specific details are given in the following description to provide a thorough understanding of the embodiments. However, it will be understood by one of ordinary skill in the art that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments. A computing system may be used to execute any of the tasks or operations described herein. In embodiments, a computing system includes memory and a processor and is operable to execute computer-executable instructions stored on a computer readable medium that define processes or operations described herein.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc. When a process corresponds to a function, its termination corresponds to a return of the function to the calling function or the main function.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine-readable medium such as a storage medium. A processor(s) may perform the necessary tasks. A code segment may represent a procedure, a function, a subprogram, a program, a routine, a subroutine, a module, an object, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

In light of the above description, a number of advantages of the present disclosure are readily apparent. For example, the library provides a simple physical storage system for multiple removable disk cartridges. The user can easily access the removable disk drive bays 104 (FIGS. 1C-1D) to insert or remove the removable disk cartridges without complicated machinery. Further, not every removable disk cartridge needs to be communicated with at every moment. The movable connector 150 allows a storage system to electrically connect any removable disk cartridge without extensive cabling. The retention system 200 (FIG. 2) allows the movable connector system 152 to mate the connectors on the removable disk cartridges without having the removable disk cartridge pushed from the removable disk drive bay 104 (FIGS. 1C-1D). The eject system 300 (FIGS. 3A-3E) provides a simple means for disengaging and ejecting the removable disk cartridge.

A number of variations and modifications of the disclosure can also be used. In embodiments, the movable connector system 150 can have different configurations. For example, a single vertical member 142 (FIGS. 1A-1C) may extend from a single horizontal rail at the bottom of the movable connector system 150. The vertical member can move horizontally. The movable connector system 150 may move vertically along the single vertical member 142 (FIGS. 1A-1C). There may be multiple components that allow redundancy, connection with multiple removable disk cartridges, and/or faster connection time because one request does not need to wait for the movable connector 150 to finish a previous job.

It will be apparent to those skilled in the art that substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed.

While the principles of the disclosure have been described above in connection with specific apparatuses and methods, it is to be clearly understood that this description is made only by way of example and not as limitation on the scope of the disclosure.

What is claimed is:

1. A movable connector system for coupling a connector to a removable disk drive inserted in an array of removable disk drive bays, the movable connector system comprising:
   a first member, the first member oriented in a vertical position parallel with the array, the first member having a first end and a second end, the first end of the first member supported at a base of the first member;
   a second member, the second member oriented in a vertical position parallel with the array and parallel with the first member, the second member having a first end and a second end, the first end of the second member supported at a base of the second member;
   a movable armature movably connected to the second member and the first member, the movable armature operable to move vertically along the second member and the first member;
   a movable connector assembly movably connected to the movable armature, the movable connector assembly operable to move horizontally along the movable armature, the movable connector assembly including the connector; and
   a cable connected to the connector of the movable connector assembly and to a system controller, the cable electrically connecting the removable disk drive connected to the connector with the system controller.

2. The movable connector system as defined in claim 1, further comprising a cabinet connected to the first member and the second member, the cabinet providing support for the first member and the second member and holding the first member and the second member in the vertical position and substantially parallel.

3. A movable connector system for coupling a connector to a removable disk drive inserted in an array of removable disk drive bays, the movable connector system comprising:
   a first member, the first member oriented in a vertical position parallel with the array, the first member having a first end and a second end, the first end of the first member supported at a base of the first member;
   a second member, the second member oriented in a vertical position parallel with the array and parallel with the first member, the second member having a first end and a second end, the first end of the second member supported at a base of the second member;
   a movable armature movably connected to the second member and the first member, the movable armature operable to move vertically along the second member and the first member; and
   a movable connector assembly movably connected to the movable armature, the movable connector assembly operable to move horizontally along the movable armature, the movable connector assembly including the connector;
   wherein the movable connector assembly comprises an eject system, the eject system coupled to a retention system and connected to the removable disk drive, wherein the eject system disengages the retention system in the removable disk drive bay, and wherein the eject system pushes the removable disk drive through a cavity in a removable disk drive bay a distance to allow extraction of the removable disk drive.

4. The movable connector system as defined in claim 3, wherein the retention system comprises:
   a lever rotatably connected at a pivot to a bottom of the removable disk drive bay; and
   a spring attached at a first end to a second end of the lever and at a second end to a rear of the array, the spring exerting a force that pushes a first end of the lever vertically.

5. The movable connector system as defined in claim 4, wherein the lever further comprises a detent, the detent formed in the first end of the lever, the detent engaging an indention in the removable disk drive to secure the removable disk cartridge drive in the removable disk drive bay.

6. The movable connector system as defined in claim 4, wherein the ejection system comprises:
   a release flange rotatably connected to a first end of an axle;
   a cam rotatably connected to a second end of the axle, wherein the axle is set into a platform holding the movable connector assembly;
   wherein the release flange and cam are rotated into an eject position, wherein the release flange contacts at a second end of the lever and, when moved in a Z-axis direction, extends the spring and causes a first end of the lever to move downward; and
   wherein the cam contacts a rear of the removable disk drive, and, when moved in the Z-axis direction, pushes the removable disk drive from the removable disk drive bay.

7. The movable connector system as defined in claim 3, wherein the ejection system comprises:
   a release flange rotatably connected to a first end of an axle;
   a cam rotatably connected to a second end of the axle, wherein the axle is set into a platform holding the movable connector assembly;
   wherein the release flange and cam are rotated into an eject position, wherein the release flange contacts at a second end of a lever and, when moved in a Z-axis direction, extends the spring and causes a first end of the lever to move downward; and
   wherein the cam contacts a rear of the removable disk drive, and, when moved in the Z-axis direction, pushes the removable disk drive from the removable disk drive bay.

8. The movable connector system as defined in claim 3, further comprising a cabinet connected to the first member and the second member, the cabinet providing support for the first member and the second member and holding the first member and the second member in the vertical position and substantially parallel.

* * * * *

UNITED STATES PATENT AND TRADEMARK OFFICE
CERTIFICATE OF CORRECTION

PATENT NO. : 8,305,706 B2
APPLICATION NO. : 12/171516
DATED : November 6, 2012
INVENTOR(S) : Randy Kerns et al.

It is certified that error appears in the above-identified patent and that said Letters Patent is hereby corrected as shown below:

CLAIMS

| Column | Line | PTO | Should Read |
|---|---|---|---|
| 12 | 23 | "disk cartridge drive in the removable" | -- disk drive in the removable -- |

Signed and Sealed this
Fifth Day of February, 2013

Teresa Stanek Rea
*Acting Director of the United States Patent and Trademark Office*